US009660173B2

(12) United States Patent
Oh et al.

(10) Patent No.: US 9,660,173 B2
(45) Date of Patent: May 23, 2017

(54) VIBRATION GENERATING APPARATUS

(71) Applicants: SAMSUNG ELECTRO-MECHANICS CO., LTD., Suwon-Si (KR); IUCF-HYU(Industry-University Cooperation Foundation Hanyang University), Seoul (KR)

(72) Inventors: Hwa Young Oh, Suwon-Si (KR); Seung Hyeon Jeong, Suwon-Si (KR); Gun Hee Jang, Seoul (KR); Ja Hyun Nam, Seoul (KR); Tae Heum Yeon, Seoul (KR); Young Jin Kim, Seoul (KR)

(73) Assignees: MPLUS CO., LTD., Suwon-si, Gyeonggi-Do (KR); IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 552 days.

(21) Appl. No.: 14/285,564

(22) Filed: May 22, 2014

(65) Prior Publication Data

US 2015/0188455 A1 Jul. 2, 2015

(30) Foreign Application Priority Data

Dec. 30, 2013 (KR) .................. 10-2013-0167537

(51) Int. Cl.
*H01L 41/09* (2006.01)
*B06B 1/06* (2006.01)
(Continued)

(52) U.S. Cl.
CPC ........ *H01L 41/0926* (2013.01); *B06B 1/0603* (2013.01); *B06B 1/0651* (2013.01); *B06B 1/14* (2013.01); *H01L 41/053* (2013.01)

(58) Field of Classification Search
CPC . H01L 41/0926; H01L 41/053; B06B 1/0603; B06B 1/0651; B06B 1/14; H02N 2/00
(Continued)

(56) References Cited

U.S. PATENT DOCUMENTS 4,937,488 A * 6/1990 Fujie ...................... H02N 2/163
310/323.03
5,107,163 A * 4/1992 Umemura .............. H02N 2/166
310/323.04
(Continued)

FOREIGN PATENT DOCUMENTS

CN 201227623 Y 4/2009
CN 103023266 A 4/2013
(Continued)

OTHER PUBLICATIONS

KIPO Office Action for Korean Application No. 10-2013-0167537.
(Continued)

*Primary Examiner* — Thomas Dougherty
(74) *Attorney, Agent, or Firm* — LRK Patent Law Firm (57) ABSTRACT

There is provided a vibration generating apparatus including: a housing having an internal space; a vibrating plate fixedly installed in the housing and having a disc shape; a piezoelectric element fixed to the vibrating plate and having a hollow disc shape; and a vibration element vibrating together with the vibrating plate when the piezoelectric element is deformed.

9 Claims, 5 Drawing Sheets

(51) Int. Cl.
   *H02N 2/00* (2006.01)
   *H01L 41/053* (2006.01)
   *B06B 1/14* (2006.01)

(58) Field of Classification Search
   USPC .................................................. 310/311–371
   See application file for complete search history.

(56) References Cited

U.S. PATENT DOCUMENTS

| | | | |
|---|---|---|---|
| 7,365,475 B2 * | 4/2008 | Kurosawa | H02N 2/0065 310/323.02 |
| 2011/0002485 A1 * | 1/2011 | Onishi | B06B 1/0603 381/190 |
| 2012/0212100 A1 | 8/2012 | Lee | |

FOREIGN PATENT DOCUMENTS

| | | | |
|---|---|---|---|
| JP | 07213997 A | 8/1995 | |
| JP | 2000140759 A | 5/2000 | |
| JP | 2001-17917 A | 1/2001 | |
| KR | 10-2006-0000894 A | 1/2006 | |
| KR | 10-2011-0045486 | 5/2011 | |
| KR | 10-1283918 | 7/2013 | |

OTHER PUBLICATIONS

SIPO Office Action for Chinese Application No. 201410261955.2.
Office Action dated May 20, 2015 for Korean Patent Application No. 10-2013-0167537 and its English summary provided by Applicant's foreign counsel.

* cited by examiner

VIBRATION GENERATING APPARATUS

CROSS-REFERENCE TO RELATED APPLICATION

This application claims the benefit of Korean Patent Application No. 10-2013-0167537 filed on Dec. 30, 2013, with the Korean Intellectual Property Office, the disclosure of which is incorporated in its entirety herein by reference.

BACKGROUND

The present disclosure relates to a vibration generating apparatus.

A vibration generating apparatus, converting electric energy into mechanical vibrations using a principle of generating electromagnetic force, has been mounted in mobile phones to thereby be used for silently notifying a user of call reception by transferring vibrations thereto.

Meanwhile, in accordance with the rapid growth in a mobile phone market and the trend toward the addition of several functions to mobile phones, mobile phone components have been required to be compact while being high quality. In accordance with this trend, the necessity of developing vibration generating apparatuses having novel structures capable of overcoming disadvantages of existing vibration generating apparatuses and significantly improving quality has increased.

In addition, recently, in many markets, mobile phones have been replaced by smart phones in which a touch screen scheme is adopted. Therefore, the use of vibration generating apparatuses, provided for the purpose of generating vibrations at the time of a user touch, has increased.

Levels of performance particularly required of vibrations generated at the time of touching a touch screen are as follows. First, since the number of vibrations generated at the time of touching the touch screen is larger than that of vibrations generated at the time of call reception, an effective operational lifespan of a vibration generating apparatus should be lengthened. Second, in order to increase user satisfaction when a user experiences vibrations at the time of touching the touch screen, a response speed of the vibrations should increase in accordance with a user's speed in touching a touch screen.

In addition, a piezo haptic actuator has been used as a device capable of implementing such performance. Such a piezo haptic actuator uses the principle of an inverse piezoelectric effect in which displacement is generated in the case that a voltage is applied to a piezo-element, that is, the principle of allowing a mass body to be moved by the generated displacement to generate vibratory force.

A vibration element having the above-mentioned structure has the following features. A bandwidth of a frequency allowing for a predetermined level or more of vibratory force to be obtained may be relatively wide, such that stable vibration characteristics may be implemented, and vibrations having high and low frequencies rather than a single frequency within a predetermined frequency range may be variously applied. In addition, since the vibration element allows for rapid operational response characteristics, it may be appropriate for implementing haptic vibrations in mobile devices such as mobile phones, or the like.

Such a piezo-element generally has a rectangular parallelepiped shape in which a length thereof is greater than a width thereof. In this case, since the length of the piezo-element should be relatively long in order to secure sufficient displacement and vibratory force, an overall length of the vibration generating apparatus may be increased and the piezo-element may be vulnerable to impacts occurring when being dropped.

Further, since the overall shape of the vibration generating apparatus is rectangular parallelepiped, the overall volume thereof may be increased, whereby it may be problematic in terms of the miniaturization of components.

RELATED ART DOCUMENT (Patent Document 1) Korean Patent Laid-Open Publication No. 2006-0000894

SUMMARY

An aspect of the present disclosure may provide a vibration generating apparatus capable of being miniaturized and increasing an amount of vibrations.

According to an aspect of the present disclosure, a vibration generating apparatus may include a housing having an internal space; a vibrating plate fixedly installed in the housing and having a disc shape; a piezoelectric element fixed to the vibrating plate and having a hollow disc shape; and a vibration element vibrating together with the vibrating plate when the piezoelectric element is deformed.

The vibration element may include: an elastic member connected to an edge of the vibrating plate; an installation member fixed to a central portion of the elastic member; and a mass member fixed to the installation member to be vibrated together with the elastic member.

The mass member may include a first mass body fixed to an outer surface of the installation member and having a coin shape.

The mass member may further include a second mass body fixed to an inner surface of the installation member and having a cylindrical shape.

The second mass body may have a damper member disposed on at least one of a top surface and a bottom surface thereof.

The elastic member may include a ring portion fixed to the vibrating plate, an elastic deformation portion inwardly extended from the ring portion, and a disc portion connected to the elastic deformation portion and having the installation member seated thereon.

The housing may include a case having an internal space and an opened lower end portion, and a bracket assembled with the lower end portion of the case and having a plate shape.

A central portion of the vibrating plate may be fixed to an installation base of the bracket.

The vibration generating apparatus may further include a circuit board connected to the piezoelectric element and having one end exposed to the outside of the housing.

According to another aspect of the present disclosure, a vibration generating apparatus may include: a housing having an internal space; a vibrating plate fixed to an installation base within the housing and having a disc shape; a piezoelectric element fixed to the vibrating plate and having a hollow disc shape; an elastic member disposed on a surface of the vibrating plate opposite to a surface thereof to which the piezoelectric element is fixed; an installation member fixed to a central portion of the elastic member; and a mass member fixed to the installation member to be vibrated together with the elastic member.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 1:
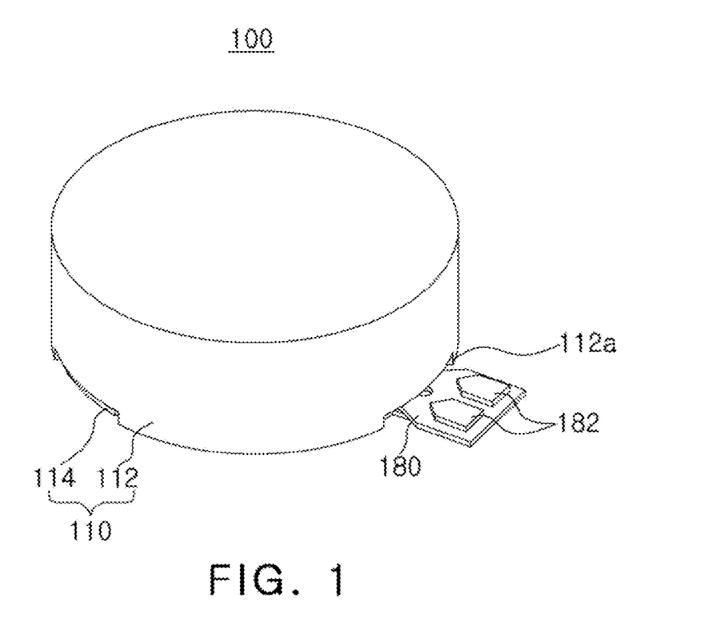
FIG. 1 is a perspective view of a vibration generating apparatus according to an exemplary embodiment of the present disclosure.
Figure 2:
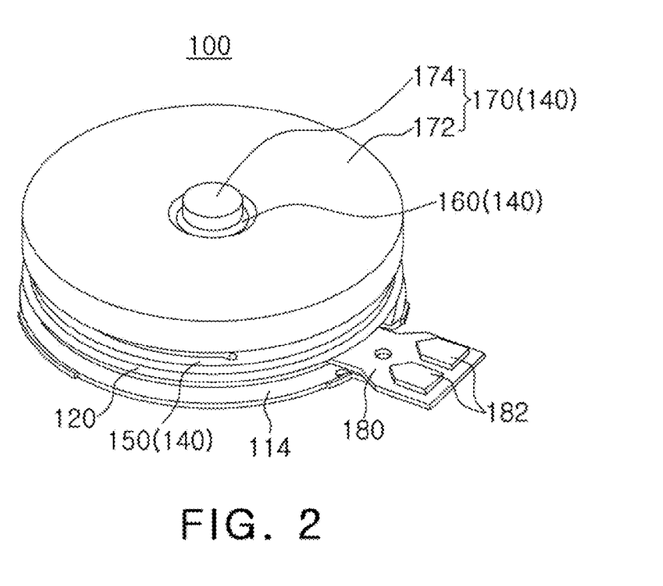
FIG. 2 is a perspective view of a vibration generating apparatus from which a case is removed according to an exemplary embodiment of the present disclosure is removed.
Figure 3:
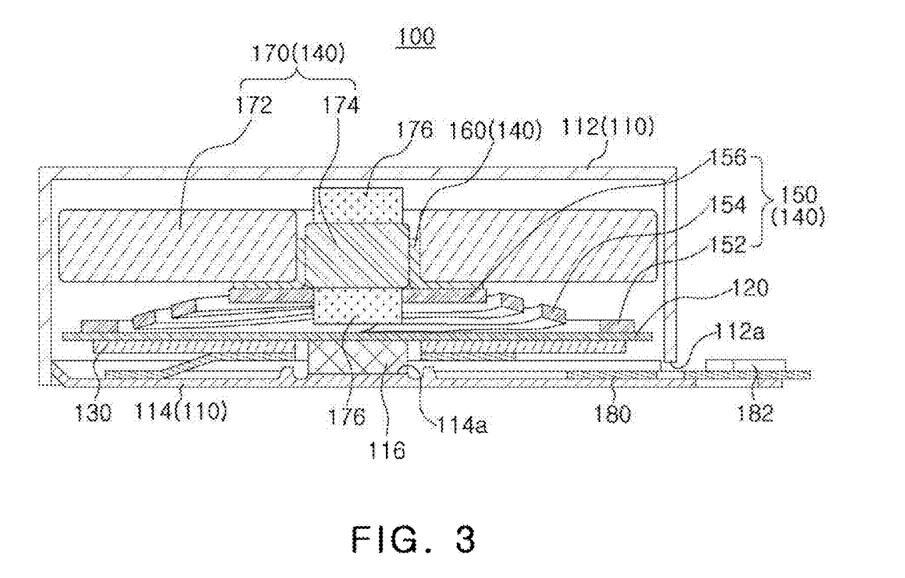
FIG. 3 is a schematic cross-sectional view of a vibration generating apparatus according to an exemplary embodiment of the present disclosure.
Figure 4:
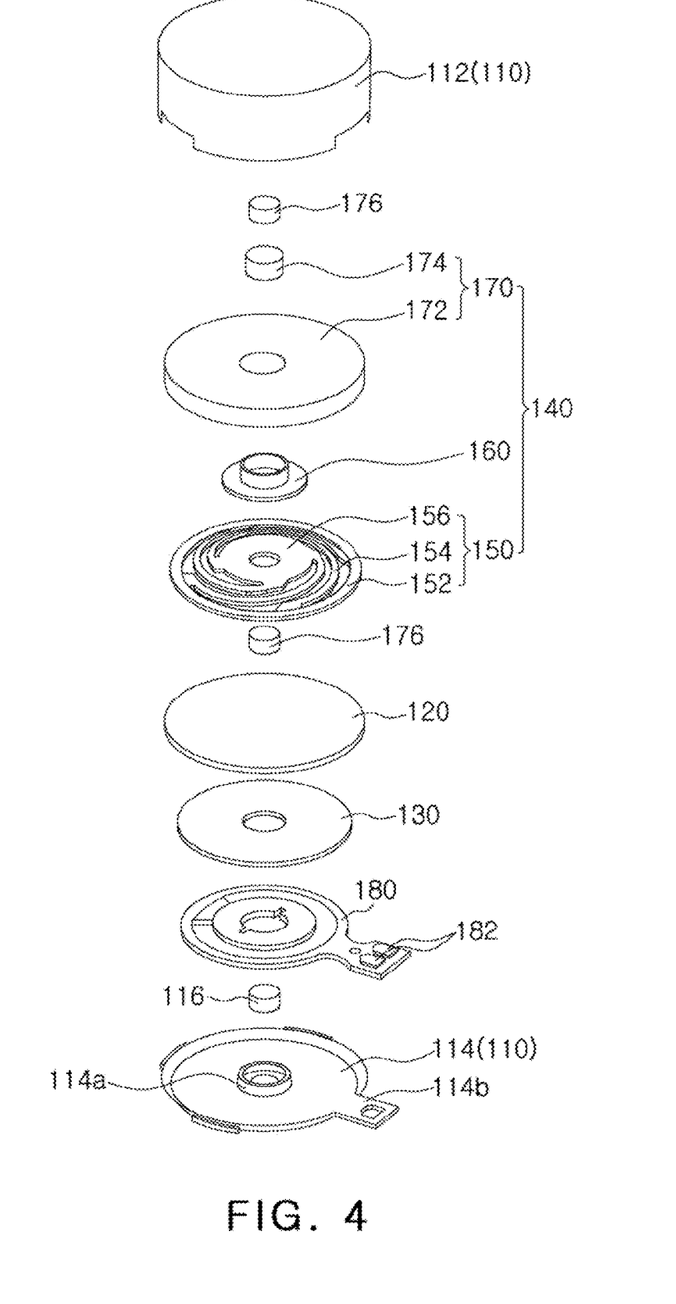
FIG. 4 is an exploded perspective view of a vibration generating apparatus according to an exemplary embodiment of the present disclosure.

FIG. 1 is a perspective view showing a vibration generating apparatus according to an exemplary embodiment of the present disclosure, FIG. 2 is a perspective view of the vibration generating apparatus from which a case is removed according to the exemplary embodiment of the present disclosure, FIG. 3 is a schematic cross-sectional view of the vibration generating apparatus according to the exemplary embodiment of the present disclosure, and FIG. 4 is an exploded perspective view of the vibration generating apparatus according to the exemplary embodiment of the present disclosure.

Referring to FIGS. 1 through 4, a vibration generating apparatus 100 according to an exemplary embodiment of the present disclosure may include a housing 110, a vibrating plate 120, a piezoelectric element 130, an vibration element 140, and a circuit board 180 by way of example.

Here, terms with respect to directions will be described. As viewed in FIG. 1, a height direction refers to a vertical direction. As viewed in FIG. 3, a radial direction refers to a horizontal direction, that is, a direction from an outer peripheral surface of the housing 110 toward a center thereof or a direction from the center of the housing 110 toward the outer peripheral surface thereof, and a circumferential direction refers to a direction rotating along the outer peripheral surface of the housing 110.

The housing 110 may have an internal space. The housing 110 may have a coin shape having the internal space. In other words, the housing 110 may have a circular shape when viewed from the top.

Meanwhile, the housing 110 may include a case 112 having an internal space and an opened lower end portion, and a bracket 114 assembled with the lower end portion of the case 112 and having a plate shape.

In addition, the case 112 may be provided with a groove 112a through which the circuit board 180 is led out, as shown in FIG. 3.

In addition, the bracket 114 may serve to close the opened lower end portion of the case 112. In addition, the bracket 114 may include an installation portion 114a to which an installation base 116 is fixed. The installation base 116 may be fixedly installed on the installation portion 114a and may have a cylindrical shape.

As an example, a lower end portion of the installation base 116 may be disposed to be inserted into the installation portion 114a having a groove shape and may be fixed thereto by an adhesive.

The installation base 116 is separately manufactured and installed on the installation portion 114a of the bracket 114 as in the present exemplary embodiment; however, the present disclosure is not limited thereto. That is, the installation base 116 may be formed integrally with the bracket 114.

Meanwhile, the bracket 114 may be provided with an extension portion 114b extended in a radial direction of the bracket 114 so that one end of the circuit board 180 led to the outside of the housing 110 is seated thereon.

In addition, although not illustrated in the present exemplary embodiment, a plurality of buffer members (not shown) may be installed on an inner surface of the case 112 in order to suppress occurrence of noise and damage to the case 112 resulting from contact with the vibration element 140.

The buffer members may be formed of a material capable of alleviating impacts such as a magnetic fluid, a rubber, and the like.

The vibrating plate 120 may be fixedly installed in the housing 110 and may have a disc shape. As an example, a central portion of the vibrating plate 120 may be fixedly installed on an upper surface of the installation base 116 inside the housing 110.

Meanwhile, the vibrating plate 120 may be deformed together with the piezoelectric element 130 when the piezoelectric element 130 is deformed, thereby serving to allow the vibration element 140 to vibrate. That is, the vibrating plate 120 may serve to amplify a deformation of the piezoelectric element 130 to thereby transfer the amplified deformation to the vibration element 140.

In addition, since the central portion of the vibrating plate is fixed to the installation base 116, an edge of the vibrating plate 120 may be deformed in a vertical direction at the time of the deformation of the piezoelectric element 130, thereby amplifying vibrations.

In addition, the vibrating plate 120 may be formed of a metal material byway of example. Further, the vibrating plate 120 may be formed of a steel material.

The piezoelectric element 130 may be installed on the vibrating plate 120 and may have a hollow disc shape. The piezoelectric element 130 may have a donut-like shape and may be installed on a bottom surface of the vibrating plate 120, by way of example. In addition, a hole may be formed in a central portion of the piezoelectric element 130 such that it penetrates through the installation base 116 to allow the vibrating plate 120 to be fixedly installed on the installation base 116.

Meanwhile, the piezoelectric element 130 may be provided with an electrode (not shown) to which power is applied. In addition, the electrode may be formed in a horizontal direction, and when the power is applied to a top surface and a bottom surface of the piezoelectric element 130, tension compression may be created to cause the edge portion of the piezoelectric element 130 to be vertically moved rather than the central portion thereof. For example, a vertical displacement of the edge portion of the piezoelectric element 130 may be about several microns.

As such, when the power is applied to the piezoelectric element 130, the edge portions of the piezoelectric element 130 and the vibrating plate 120 may be moved in a vertical direction to cause the vibration element 140 to vibrate.

The vibration element 140 may vibrate together with the vibrating plate 120 at the time of the deformation of the piezoelectric element 130. To this end, the vibration element 140 may be coupled to a top surface of the vibrating plate 120.

More particularly, the vibration element 140 may include an elastic member 150, an installation member 160, and a mass member 170.

The elastic member 150 may be coupled to the edge portion of the vibrating plate 120. That is, an edge portion of the elastic member 150 may be fixed to the vibrating plate 120 and a central portion thereof may be fixed to the installation member 160.

In addition, the elastic member 150 may serve to provide elastic force so that the vibration element 140 may vibrate in the vertical direction at the time of the deformation of the piezoelectric element 130.

Meanwhile, the elastic member 150 may include a ring portion 152 fixed to the edge of the vibrating plate 120, an elastic deformation portion 154 inwardly extended from the ring portion 152, and a disc portion 156 connected to the elastic deformation portion 154 and having the installation member 160 seated thereon.

The elastic deformation portion 154 may have a spiral shape and may connect the disc portion 156 and the ring portion 152 to each other, such that it may be expanded in the vertical direction.

The elastic member in the present exemplary embodiment is formed of a leaf spring by way of example, but the present disclosure is not limited thereto. That is, the elastic member may be formed of a coil spring. That is, any member capable of providing elastic force may replace the elastic member.

The installation member 160 may be fixedly installed on an upper surface of the disc portion 156 of the elastic member 150 and may have a 'L'-like cross-section by way of example. Meanwhile, the installation member 160 may serve to fix the mass member 170.

That is, the installation member 160 may have a 'L'-like cross-section so that the mass member 170 may be fixedly installed on an outer peripheral surface and in a hollow portion of the installation member 160. In other words, a first mass body 172 may be fixedly installed on an outer surface of the installation member 160 and a second mass body 174 may be fixedly installed on an inner surface of the installation member 160.

In addition, a central portion of a bottom surface of the first mass body 172 may be seated on a bent portion of the installation member 160.

Meanwhile, the vibration element 140 in the present exemplary embodiment includes the installation member 160, but the present disclosure is not limited thereto. That is, the installation member 160 may be omitted. That is, the mass member 170 may be directly fixed to the elastic member 150.

In addition, the cross-section of the installation member 160 in the present exemplary embodiment has the 'L'-like shape by way of example, but the present disclosure is not limited thereto. That is, the shape of the installation member 160 may be varied.

The mass member 170 may include the first mass body 172 fixedly installed on the outer surface of the installation member 160 and having a coin shape and the second mass body 174 fixedly installed on the inner surface of the installation member 160 and having a cylindrical shape.

Meanwhile, the first and second mass bodies 172 and 174 may be formed of a material having a high specific gravity. For example, the first and second mass bodies 172 and 174 may be formed of a material such as tungsten or iron. In other words, in order to increase an amount of vibrations by adjusting a resonance frequency through an increase in mass of the vibration element 140 within the same volume, the first and second mass bodies 172 and 174 may be formed of a material having a high specific gravity.

A damper member 176 may be installed on at least one of a top surface and a bottom surface of the second mass body 174, such that the damper member 176 prevents the second mass body 174 from being in contact with the housing 110 and the vibrating plate 120 at the time of generation of vibrations or application of external impacts.

However, since the damper member 176 is a component for preventing occurrence of noise and impact, it may be omitted.

In addition, the mass member 170 in the present exemplary embodiment includes the first and second mass bodies 172 and 174 by way of example, but the present disclosure is not limited thereto. That is, the mass member 170 may only be formed of one of the first and second mass bodies 172 and 174.

Further, the vibration element 140 in the present exemplary embodiment includes the elastic member 150, the installation member 160, and the mass member 170 by way of example, but the present disclosure is not limited thereto. That is, the configuration of the vibration element 140 may be varied. For example, the vibration element 140 may only include the elastic member 150 and the mass member 170 or may only include the elastic member 150 formed of a coil spring instead of a leaf spring and the mass member 170.

The circuit board 180 may be connected to the piezoelectric element 130 and one end thereof may be exposed to the outside of the housing 110. In addition, one end of the circuit board 180 exposed to the outside of the housing 110 may be provided with a connection electrode 182 for making connection to an external power supply.

Meanwhile, as an example, the circuit board 180 may have an approximately circular ring shape to correspond to the piezoelectric element 130.

In addition, since the circuit board 180 is connected to the piezoelectric element 130 having a relatively small deformation amount, it may be less affected by damage caused by the vibrations of the vibration element 140. Accordingly, the circuit board 180 may become thinner.

As an example, the circuit board 180 may be a flexible circuit board.

As described above, the vibration generating apparatus 100 may have a coin shape through the piezoelectric element 130 having the disc shape. Therefore, the vibration generating apparatus 100 may be miniaturized and thinned.

Further, since a volume occupied by the mass member 170 per unit volume may be increased by the mass member 170 including the first and second mass bodies 172 and 174, the amount of vibrations may be increased.

Hereinafter, an operation of a vibration generating apparatus according to an exemplary embodiment of the present disclosure will be described with reference to the accompanying drawings.

Figure 5:
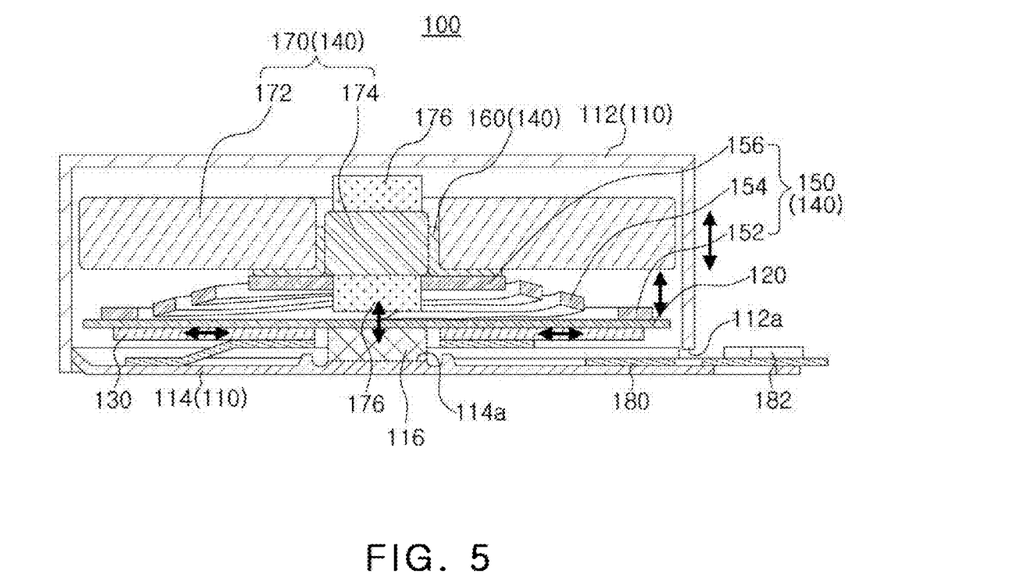
FIG. 5 is a view illustrating an operation of a vibration generating apparatus according to an exemplary embodiment of the present disclosure.
Figure 6A:
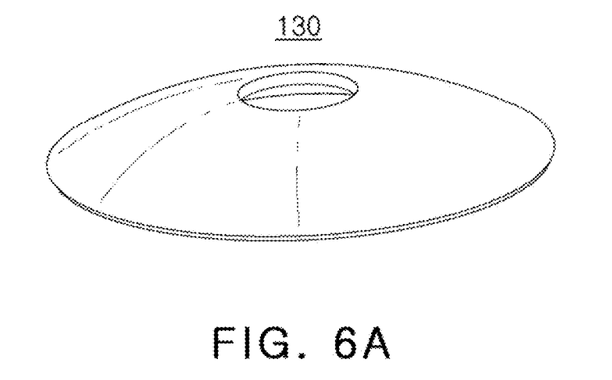
FIGS. 6A and 6B are views illustrating a deformed state of a piezoelectric element provided in a vibration generating apparatus according to an exemplary embodiment of the present disclosure.
Figure 6B:
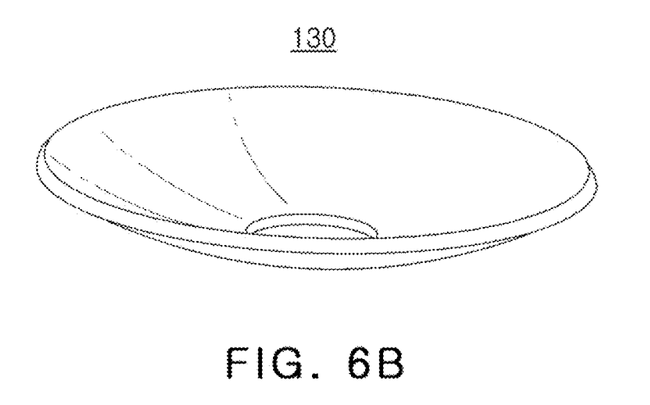

FIG. 5 is a view illustrating an operation of a vibration generating apparatus according to an exemplary embodiment of the present disclosure, and FIGS. 6A and 6B are views illustrating a deformed state of a piezoelectric element disposed in the vibration generating apparatus according to the exemplary embodiment of the present disclosure.

First, in the case in which power is supplied through the circuit board 180, the piezoelectric element 130 may be deformed. Meanwhile, the electrode of the piezoelectric element 130 to which the power is applied may be formed in the horizontal direction and when the power is applied to the top surface and the bottom surface of the piezoelectric element 130, tension compression may be created in the radial direction as shown in FIG. 5 while the edge portion of the piezoelectric element 130 rather than the central portion thereof may be vertically moved as shown in FIGS. 6A and 6B.

Meanwhile, a magnitude of such a vertical displacement may be about several microns.

When the piezoelectric element 130 is deformed as described above, the vibrating plate 120 to which the piezoelectric element 130 is fixed may also be deformed together with the piezoelectric element 130. In addition, since the central portion of the vibrating plate 120 is fixedly installed on the installation base 116, the edge portion of the vibrating plate 120 may also be deformed in the vertical direction. The vibrating plate 120 may be deformed to have a larger deformation amount than that of the edge portion of the piezoelectric element 130.

Therefore, the vibration element 140 installed on the top surface of the vibrating plate 120 may vibrate together with the vibrating plate 120.

More specifically, the ring portion 152 of the elastic member 150 may be deformed together with the vibrating plate 120 due to the deformation of the vibrating plate 120, such that the elastic deformation portion 154 connected to the ring portion 152 may be vibrated in the vertical direction.

Thereafter, since the mass member 170 fixedly installed on the installation member 160 is also vibrated together with the elastic member 150, the vibrations generated by the deformation of the piezoelectric element 130 may be amplified.

As described above, the vibration generating apparatus 100 may have a coin shape through the piezoelectric element 130 having a disc shape. Therefore, the vibration generating apparatus 100 may be miniaturized and thinned.

Further, since a volume occupied by the mass member 170 per unit volume may be increased by the mass member 170 including the first and second mass bodies 172 and 174, the amount of vibrations may be increased.

As set forth above, according to exemplary embodiments of the present disclosure, the vibration generating apparatus may be miniaturized and thinned by the piezoelectric element having a disc shape, while increasing the amount of vibrations by the mass member including the first and second mass bodies.

While exemplary embodiments have been shown and described above, it will be apparent to those skilled in the art that modifications and variations could be made without departing from the spirit and scope of the present disclosure as defined by the appended claims.

What is claimed is:

1. A vibration generating apparatus, comprising:
    a housing having an internal space;
    a vibrating plate fixedly installed in the housing and having a disc shape;
    a piezoelectric element fixed to the vibrating plate and having a hollow disc shape; and
    a vibration element vibrating together with the vibrating plate when the piezoelectric element is deformed,
    wherein the vibration element comprises:
    an elastic member connected to an edge of the vibrating plate;
    an installation member fixed to a central portion of the elastic member; and
    a mass member fixed to the installation member to be vibrated together with the elastic member.

2. The vibration generating apparatus of claim 1, wherein the mass member includes a first mass body fixed to an outer surface of the installation member and having a coin shape.

3. The vibration generating apparatus of claim 2, wherein the mass member further includes a second mass body fixed to an inner surface of the installation member and having a cylindrical shape.

4. The vibration generating apparatus of claim 3, wherein the second mass body has a damper member disposed on at least one of a top surface and a bottom surface thereof.

5. The vibration generating apparatus of claim 1, wherein the elastic member includes:
    a ring portion fixed to the vibrating plate;
    an elastic deformation portion inwardly extended from the ring portion; and
    a disc portion connected to the elastic deformation portion and having the installation member seated thereon.

6. The vibration generating apparatus of claim 1, wherein the housing includes:
    a case having an internal space and an opened lower end portion; and
    a bracket assembled with the lower end portion of the case and having a plate shape.

7. The vibration generating apparatus of claim 5, wherein a central portion of the vibrating plate is fixed to an installation base of the bracket.

8. The vibration generating apparatus of claim 1, farther comprising a circuit board connected to the piezoelectric element and having one end exposed to the outside of the housing.

9. A vibration generating apparatus, comprising:
    a housing having an internal space;
    a vibrating plate fixed to an installation base within the housing and having a disc shape;
    a piezoelectric element fixed to the vibrating plate and having a hollow disc shape;
    an elastic member disposed on a surface of the vibrating plate opposite to a surface thereof to which the piezoelectric element is fixed;
    an installation member fixed to a central portion of the elastic member; and
    a mass member fixed to the installation member to be vibrated together with the elastic member.

* * * * *